United States Patent
Hirakawa et al.

[11] Patent Number: 5,814,878
[45] Date of Patent: Sep. 29, 1998

[54] SEMICONDUCTOR DEVICE

[75] Inventors: Satoshi Hirakawa; Haruo Takao, both of Fukuoka, Japan

[73] Assignee: Mitsubishi Denki Kabushiki Kaisha, Tokyo, Japan

[21] Appl. No.: 664,498

[22] Filed: Jun. 17, 1996

[30] Foreign Application Priority Data

Nov. 30, 1995 [JP] Japan .................................. 7-312556

[51] Int. Cl.⁶ ................................................ H01L 23/495
[52] U.S. Cl. ...................... 257/667; 257/669; 257/675; 257/796
[58] Field of Search .................................. 257/667, 675, 257/796, 669

[56] References Cited

U.S. PATENT DOCUMENTS

| | | | |
|---|---|---|---|
| 5,225,710 | 7/1993 | Westerkamp | 257/675 |
| 5,345,106 | 9/1994 | Doering et al. | 257/675 |
| 5,430,331 | 7/1995 | Hamzehdoost et al. | 257/796 |
| 5,440,169 | 8/1995 | Tomita et al. | 257/67 |
| 5,489,801 | 2/1996 | Blish, II | 257/675 |
| 5,530,295 | 6/1996 | Mehr | 257/675 |
| 5,641,987 | 6/1997 | Lee | 257/675 |
| 5,646,831 | 7/1997 | Manteghi | 257/675 |
| 5,652,461 | 7/1997 | Ootsuki et al. | 257/675 |
| 5,652,463 | 7/1997 | Weber et al. | 257/667 |
| 5,666,003 | 9/1997 | Shibata et al. | 257/796 |

FOREIGN PATENT DOCUMENTS

| | | |
|---|---|---|
| 58-53152 | 4/1983 | Japan . |
| 60-170248 | 9/1985 | Japan . |
| 4-277660 | 10/1992 | Japan . |
| 7-250485 | 9/1995 | Japan . |

*Primary Examiner*—David Ostrowski
*Attorney, Agent, or Firm*—Oblon, Spivak, McClelland, Maier & Neustadt, P.C.

[57] ABSTRACT

A semiconductor device including a plurality of grooves (21) formed on a top surface of a heat sink (51). A sealing resin (2) fills a portion between a lead frame (5) provided facing the top surface and the heat sink (51). The grooves (21) are formed on both sides of a center region (22) extending so as to divide the top surface in two. A power semiconductor element (11) is disposed above the center region (22) and a controlling semiconductor element (16) controlling the power semiconductor element (11) is disposed above the region where the grooves (21) are formed. The above construction suppresses thermal resistance interposed in a path through which heat loss in the power semiconductor element (11) is radiated to the heat sink (51) and improves heat radiating efficiency while maintaining close contact between the sealing resin (2) and the heat sink (51).

20 Claims, 7 Drawing Sheets

54

55

F I G . 13
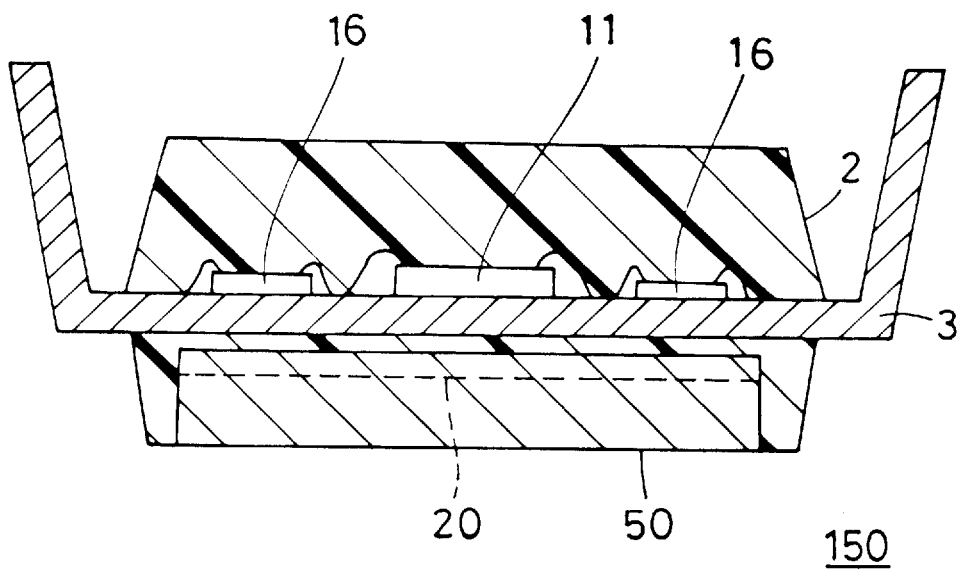
F I G . 14
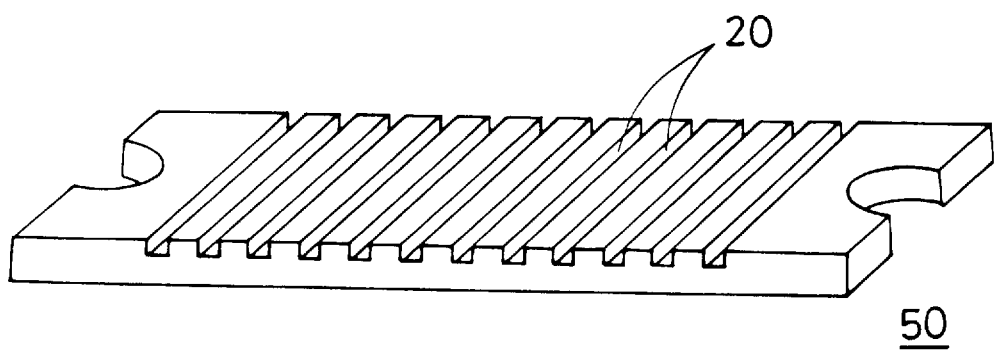

5,814,878

SEMICONDUCTOR DEVICE

BACKGROUND OF THE INVENTION

1. Field of the Invention

The present invention relates to a semiconductor device with a lead frame, a power semiconductor element provided thereon and a heat sink for heat radiation sealed with a resin, and particularly to an improvement for enhancing the heat radiating efficiency while maintaining the close contact between the heat sink and the resin.

2. Description of the Background Art

FIG. 13 is a front sectional view showing the inside structure of a conventional semiconductor device as background of the present invention. In this device 150, an IGBT element 11 as a power semiconductor element and controlling semiconductor elements 16 for controlling operation of the IGBT element 11 are affixed on the element mounting surface of a lead frame 3 made of copper. Also, an aluminum heat sink 50 faces the main surface of the lead frame 3 on the opposite side to the element mounting surface.

The lead frame 3 and the heat sink 50, including the various elements mounted on the element mounting surface of the lead frame 3, are encapsulated with the electrically insulating sealing resin 2. This fixedly couples the heat sink 50 and the lead frame 3 and also protects the lead frame 3 and the various elements mounted thereon from external moisture etc.

A small gap is provided between the lead frame 3 and the heat sink 50, which is filled with the sealing resin 2. This provides high electric insulation and good heat conductivity between the lead frame 3 and the heat sink 50. The bottom of the heat sink 50 is exposed to the outside, and to this exposed surface an external radiation fin, or the like is connected to radiate the loss heat generated in the IGBT element 11 to the outside through the heat sink 50.

FIG. 14 is an overall perspective view of the heat sink 50. A plurality of grooves 20) parallel to one another are formed almost all over the top main surface of the heat sink 50, i.e., the main surface facing the lead frame 3, across its one edge to the other. These grooves 20 serve to enhance the close contact between the sealing resin 2 and the heat sink 50 and also to enhance the fluidity of the sealing resin 2 in the process of filling with the sealing resin 2 when manufacturing the device 150.

In the conventional device 150 having the grooves 20 formed on the top main surface of the heat sink 50, however, the sealing resin 2 is interposed extra thick corresponding to the depth of the grooves 20 between the IGBT element 11 and the heat sink 50. This is a factor which increases the thermal resistance in the path of the loss heat generated in the IGBT element 11 to the heat sink 50. That is to say, the conventional device 150 sacrifices the radiating efficiency of the loss heat to improve the close contact between the sealing resin 2 and the heat sink 50 and to improve the fluidity of the sealing resin 2.

SUMMARY OF THE INVENTION

A first aspect of the present invention is directed to a semiconductor device which comprises: a lead frame being like a sheet and electrically well conducting, the lead frame having one side main surface and the other side main surface; a power semiconductor element fixed on the one side main surface; a heat sink being thermally well conducting and having one main surface, the one main surface provided to face the other side main surface with a gap; and a sealing resin which is electrically insulating and fills the gap to couple the lead frame and the heat sink to each other while maintaining electric insulation from each other and seals the power semiconductor element; wherein a first region and a second region which is a remaining region other than the first region are defined in the one main surface of the heat sink, the first region is flat in its entire region and a groove is formed in the second region, and the power semiconductor element is disposed on the one side main surface selectively in a region covering the first region.

Preferably, according to a second aspect of the present invention, the semiconductor device further comprises a controlling semiconductor element for controlling the power semiconductor element, the controlling semiconductor element being fixed on the one side main surface selectively in a region covering the second region , and the sealing resin seals the controlling semiconductor element, too.

Preferably, in the semiconductor device according to a third aspect of the present invention, the groove is separated into a plurality of unit grooves.

Preferably, in the semiconductor device according to a fourth aspect of the present invention, all of the plurality of unit grooves extend in one direction.

Preferably, in the semiconductor device according to a fifth aspect of the present invention, at least one end of each of the plurality of unit grooves reaches an edge of the one main surface of the heat sink.

Preferably, in the semiconductor device according to a sixth aspect of the present invention, the first region is zonally defined in a position which divides the one main surface of the heat sink into two, the second region is defined being divided on both sides of the zonal first region, the plurality of unit grooves are disposed on the both sides in divided second regions, and the one direction is a direction perpendicular to an elongate direction of the zonal first region.

Preferably, in the semiconductor device according to a seventh aspect of the present invention, an end on the first region side of each of the plurality of unit grooves is formed in a surface smoothly connecting a surface of the first region and a bottom of the each.

Preferably, according to the semiconductor device of an eighth aspect of the present invention, a transverse sectional form of the groove is almost rectangular.

Preferably, in the semiconductor device according to a ninth aspect of the present invention, the transverse sectional form of the groove is a "V-shape".

According to the device of the first aspect, the power semiconductor element disposed above the first region which is a flat region in the one main surface of the heat sink allows efficient transmission of loss heat generated in the power semiconductor element to the heat sink. Also, the grooves formed in the second region which is a partial region of the one main surface of the heat sink enables excellent close contact between the heat sink and the sealing resin. That is to say, high heat radiating characteristic is obtained while maintaining close contact.

According to the device of the second aspect, since it has a controlling semiconductor element controlling the power semiconductor element, the device can be handled easily. Furthermore, since the power semiconductor element and the controlling semiconductor element are respectively disposed being separated above the first region and above the second region, the area of the first region can be reduced without deteriorating the heat radiating efficiency of loss heat of the power semiconductor element and the second region where the groove is formed can be enlarged to the maximum.

According to the device of the third aspect, the groove is separated into a plurality of unit grooves. In other words, since a plurality of grooves (unit grooves) are formed in the second region, the close contact between the sealing resin and the heat sink is still better.

According to the device of the fourth aspect, since all of the plurality of unit grooves extend in one direction, the fluidity of the resin flowing in the gap between the lead frame and the heat sink is excellent in the process of sealing with the resin.

According to the device of the fifth aspect, since at least one end of each of the plurality of unit grooves reaches the edge of the one main surface of the heat sink, the fluidity of the resin flowing in the gap between the lead frame and the heat sink is still better in the process of sealing the resin.

According to the device of the sixth aspect, since the first region is zonally defined in a position which divides the one main surface of the heat sink into two, mechanical strength of the heat sink is excellent. Furthermore, since the plurality of unit grooves are separated on both sides of the zonal first region and the unit grooves extend in the direction perpendicular to the elongate direction of the first region, the fluidity of the resin flowing in the gap between the lead frame and the heat sink is still better in the process of sealing with the resin. Particularly, it produces the effect that the resin smoothly flows in the narrowest interval between the first region and the lead frame.

According to the device of the seventh aspect, since the end of each of the plurality of unit grooves on the first region side is formed in a surface smoothly connecting the surface of the first region and the bottom of each unit groove, the fluidity of the resin flowing in the gap between the lead frame and the heat sink is still better in the process of sealing with the resin.

According to the device of the eighth aspect, the almost rectangular transverse sectional form of the groove allows still better close contact between the heat sink and the sealing resin.

According to the device of the ninth aspect, the "V-shaped" transverse sectional form of the groove especially facilitates formation of the groove by press processing.

It is an object of the present invention to provide a semiconductor device with improved loss heat radiating efficiency without deteriorating close contact between the heat sink and the sealing resin and fluidity of the sealing resin.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a front sectional view of a conventional device.

FIG. 14 is an overall perspective view of the heat sink of the conventional device.

DESCRIPTION OF THE PREFERRED EMBODIMENTS

1. First Preferred Embodiment

First, a semiconductor device according to a first preferred embodiment will be described.

<1-1. Circuit Structure>

Figure 2:
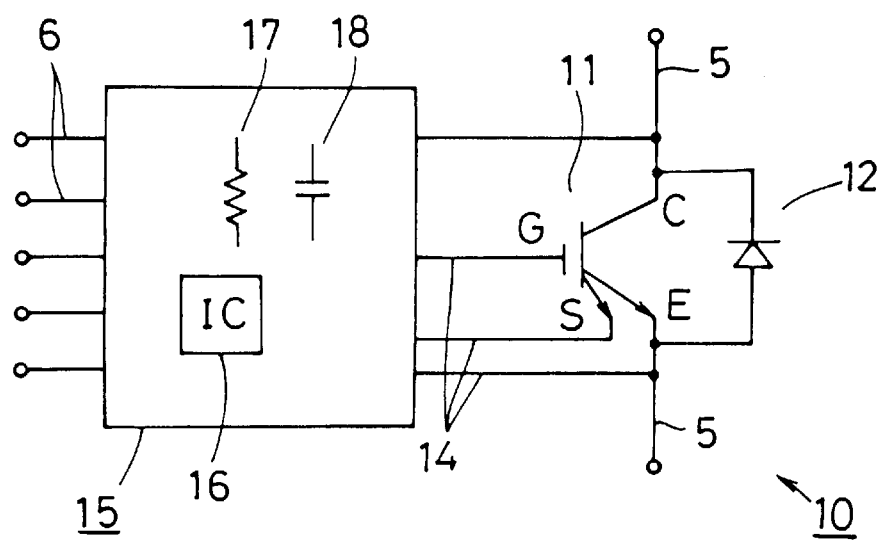
FIG. 2 is a circuit diagram of the device according to the first preferred embodiment.

FIG. 2 is a circuit diagram showing the circuit structure of a semiconductor device according to the first preferred embodiment. This device 101 includes a power circuit 10 having a power semiconductor element modulation-controlling the flow of the main current charged with supply of power to a load and a control circuit 15 controlling operation of the power semiconductor element.

The power circuit 10 includes an IGBT element 11 as a power semiconductor element and a free wheel diode 12. The IGBT element 11 conducts and cuts off (i.e., switches) the main current flowing from the collector electrode C to the emitter electrode E in response to the gate voltage signal inputted to the gate electrode G. This main current is supplied to an external load through the external terminals 5 connected to the collector electrode C and the emitter electrode E. The free wheel diode 12 connected to the IGBT element 11 in the inverse-parallel connection serves to prevent application of excessive reverse current to the IGBT element 11.

The control circuit 15 connected to the power circuit 10 through a plurality of interconnections 14 includes the controlling semiconductor element 16 as an integrated circuit element playing the main role in controlling the IGBT element 11, with a resistance element 17, a capacitance element 18, etc. These elements form a driving circuit and a protection circuit. The driving circuit is a circuit portion in the control circuit for transmitting the gate voltage signal to the gate electrode G in response to the control signal inputted to one of the plurality of external terminals 6. The protection circuit is a circuit portion for monitoring the operational environment of the IGBT element 11 to prevent damage to the IGBT element 11 when an abnormality occurs.

The protection circuit shown in FIG. 2 monitors the voltage between the collector electrode C and the emitter electrode E, i.e., the collector-emitter voltage and, when the voltage becomes too large above a certain reference value, it drives the gate electrode G to cut off the IGBT element 11 irrespective of the external control signal. The protection circuit also monitors the weak current flowing in the sense electrode S in proportion to the main current flowing in the IGBT element 11, i.e., the sense current, and when the main current becomes too large above a certain reference value, it drives the gate electrode G to cut off the IGBT element 11 irrespective of the external control signal.

Furthermore, when an excessive voltage or an excessive current occurs, the protection circuit of FIG. 2 transmits a signal indicating the occurrence of the abnormality to the outside through the external terminals 6. This way, the protection circuit serves to protect the IGBT element 11 from damage caused by an abnormality such as an excessive voltage and an excessive current, for example.

<1-2. Entire Structure>

Figure 3:
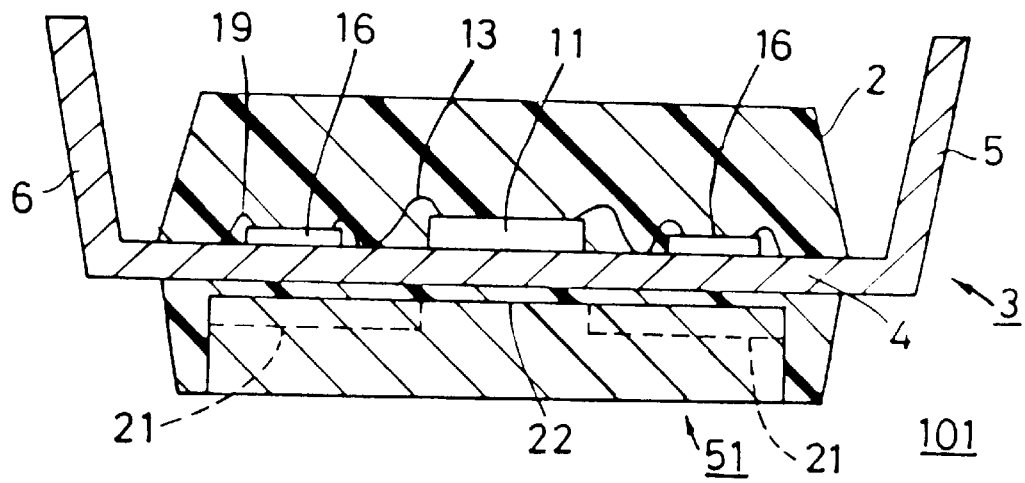
FIG. 3 is a front sectional view of the device of the first preferred embodiment.

FIG. 3 is a front sectional view of the device 101. As shown in FIG. 3, in the device 101, various elements included in the control circuit 15 and the power circuit 10 are soldered in a plurality of portions on the sheet-like lead frame 3 substantially formed of metal with good electric conductivity, such as copper. FIG. 3 shows the IGBT element 11 and the controlling semiconductor element 16 as representatives of these elements. These elements are preferably formed as bare chip elements as shown in FIG. 3.

The IGBT element 11 and other portions of the lead frame 3 are electrically connected through the aluminum bonding wires 13, for example. Similarly, the controlling semiconductor element 16 and still other portions of the lead frame 3 are electrically connected by the gold bonding wires 19, for example. The lead frame 3 forms the interconnection pattern 4 of the control circuit 15 and the power circuit 10 including the interconnection 14 and also forms the external terminal 6 and the external terminal 5.

The plate-like heat sink 51 substantially composed of well heat conducting metal such as aluminum or copper, for example, is provided to face the bottom main surface of the lead frame 3 on the opposite side of the top main surface on which the various elements are mounted (the element mounting surface). The sealing resin 2 with an electric insulating property and good thermal conductivity seals up the part of the lead frame 3 corresponding to the interconnection pattern 4, the various elements mounted on the interconnection pattern 4 and the heat sink 51.

A small gap is provided between the lead frame 3 and the heat sink 51, which is filled with the sealing resin 2. The sealing resin 2 put in the gap serves to electrically insulate the lead frame 3 and the heat sink 51 and also to well transmit the loss heat generated in the IGBT element 11 from the lead frame 3 to the heat sink 51. The sealing resin 2 also functions to fixedly couple the lead frame 3 and the heat sink 51 and to protect the interconnection pattern 4 and the various elements thereon from the external moisture and the like.

Figure 4:
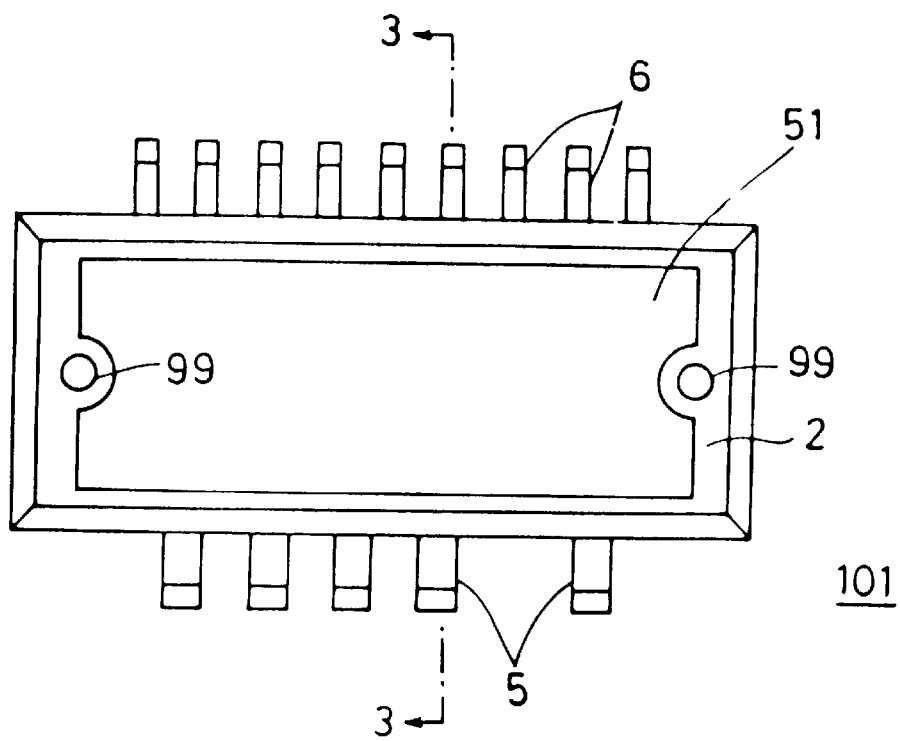
FIG. 4 is a bottom view of the device of the first preferred embodiment.

FIG. 4 is a bottom view of the device 101. FIG. 3 described above corresponds to the section taken along the A—A line in FIG. 4. As shown in FIG. 4, the external terminals 5 and the external terminals 6 protrude to the outside from the side walls of the sealing resin 2, and the bottom main surface of the heat sink, or its main surface on the side opposite to the top main surface facing the lead frame 3, is exposed in the bottom.

In usual usage of the device 101, an external heat radiation fin or the like (not shown) is connected to the device 101 so as to keep the thermal contact with the exposed surface of the heat sink 51, or its bottom main surface. This allows the-loss heat generated in the IGBT element 11 to be efficiently radiated to the outside through the heat sink 51. The sealing resin 2 is provided with a pair of through holes 99 to enable easy connection of the radiation fin etc. with screws.

<1-3. Arrangement of Heat Sink and Elements>

Figure 1:
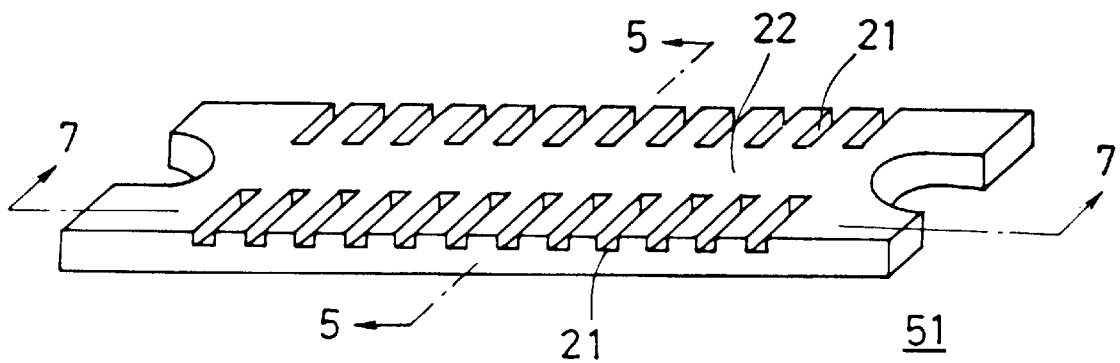
FIG. 1 is an overall perspective view of a heat sink of a device according to a first preferred embodiment.
Figure 5:
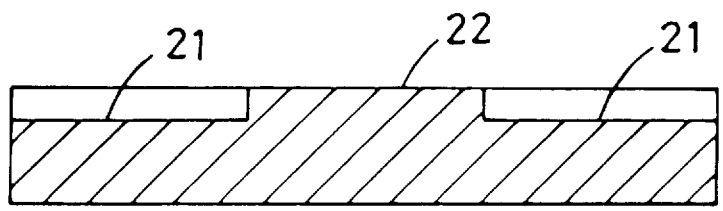
FIG. 5 is a front sectional view of the heat sink of the device according to the first preferred embodiment.

FIG. 1 is a perspective view of the heat sink 51. FIG. 5 is a sectional view of the heat sink 51 taken along the line B—B in FIG. 1. As shown in these figures, the heat sink 51 has a plurality of grooves 21 parallel to one another formed on its top main surface. Furthermore, the grooves 21 are selectively formed on both sides of the center region 22 zonally extending from one end to the other end in such a position as divides the top main surface of the heat sink 51 into two, which is characteristically different from the heat sink 50 of the conventional device 150. Especially, all the grooves 21 are formed extending in the one direction perpendicular to the elongate direction of the zonal center region 22.

Figure 6:
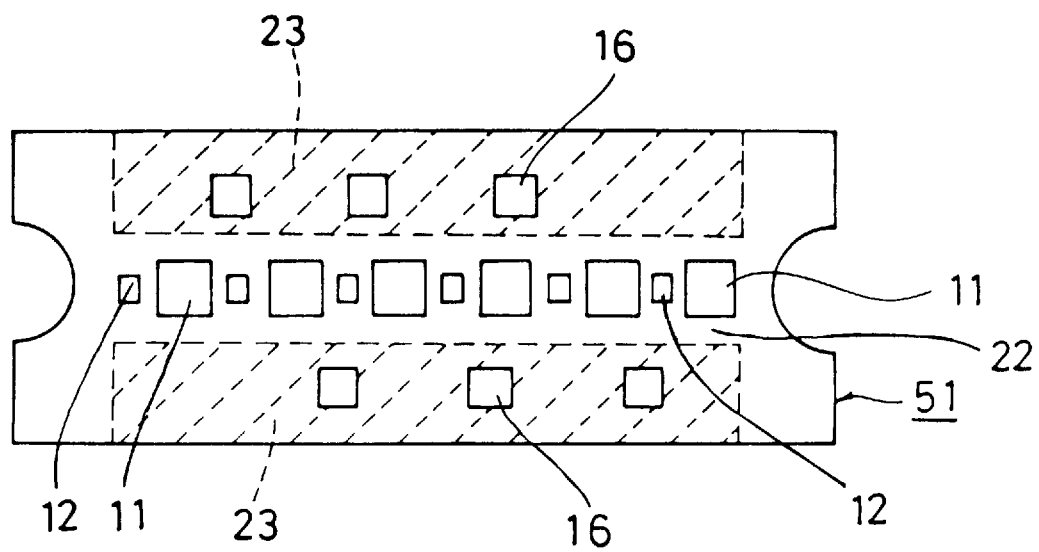
FIG. 6 is an element arrangement diagram of the device according to the first preferred embodiment.

The various elements mounted on the element mounting surface of the lead frame 3 are arranged so that they have relative relation with the region occupied by the grooves 21 and the center region 22. FIG. 6 is an element arrangement diagram showing it, which shows the elements and the heat sink 51 in overlap. As shown in FIG. 6, the device 101 has a plurality of sets of the power circuit 10 and the control circuit 15. (Six sets in the example of FIG. 6.)

As shown in FIG. 6, the IGBT element 11 and the free wheel diode 12 forming the power circuit 10, i.e., the heat generating elements, are arranged above the center region (first region) 22. On the other hand, the elements forming the control circuit 15, i.e., the elements hardly generating heat, are arranged above a both side region (second region) 23 defined separately in the both sides of the center region 22 in which the grooves 21 are arranged. FIG. 6 shows the controlling semiconductor elements 16 as representatives of elements forming the control circuits 15.

Since the grooves 21 are disposed in the both side region 23, extra sealing resin 2 exists for the depth of the grooves 21 between the lead frame 3 and the both side region 23. Thus, the thermal resistance between the lead frame 3 and the both side region 23 is as high as that in the conventional device 150. As the grooves 21 are not formed in the center region 22, however, the thermal resistance between the lead frame 3 and the center region 22 is low enough.

In the device 101, the heat generating elements and the elements generating almost no heat are separated in the center region 22 with no grooves 21 and in the both side region 23 with the grooves 21, respectively. This considerably increases the radiation efficiency of the loss heat generated from the heat generating elements such as the IGBT element 11 as compared with the conventional device 150. Especially, since the center region 22 in which the heat generating elements are disposed is positioned in the two-dividing center of the top main surface of the heat sink 51, the loss heat is liable to diffuse all over the heat sink 51, which also contributes to the increase in radiation efficiency.

Moreover, the region occupied by the heat generating elements such as the IGBT element 11 is sufficiently small as compared with the entire top main surface of the heat sink 51, so that the region in which the grooves 21 are disposed, though which is limited to the regions 23 smaller than that in the conventional device 150, covers most part of the top main surface of the heat sink 51. Accordingly, the contact performance between the sealing resin 2 and the heat sink 51 is not inferior to the conventional device 150. That is to say, the device 101 of this preferred embodiment achieves improvement of radiation efficiency while maintaining the close contact between the sealing resin 2 and the heat sink 51.

Furthermore, as the grooves 21 are not formed in the center region 22, the heat sink 51 has the advantage that it has excellent mechanical strength as compared with the heat sink 50 of the conventional device in which the grooves are formed almost all over the top main surface.

<1-4. Configuration of Grooves>

Figure 7:
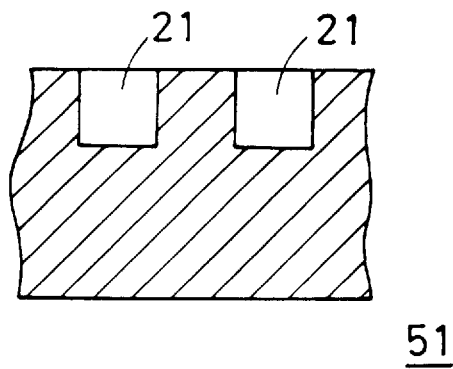
FIG. 7 is a side sectional view of the heat sink of the device according to the first preferred embodiment.

Next, the sectional form of the grooves 21 will be described. FIG. 7 is a sectional view of the heat sink 51 taken along the line C—C in FIG. 1, which shows the transverse sectional form of the grooves 21. As shown in FIG. 7, the transverse section of the grooves 21 is rectangular in the heat sink 51 of the device 101. Accordingly, the close contact between the sealing resin 2 and the heat sink 51 is especially excellent. Instead of the rectangular transverse section, the grooves 21 may be almost rectangular in cross section, such as "U-shaped", to produce corresponding effects.

Figure 8:
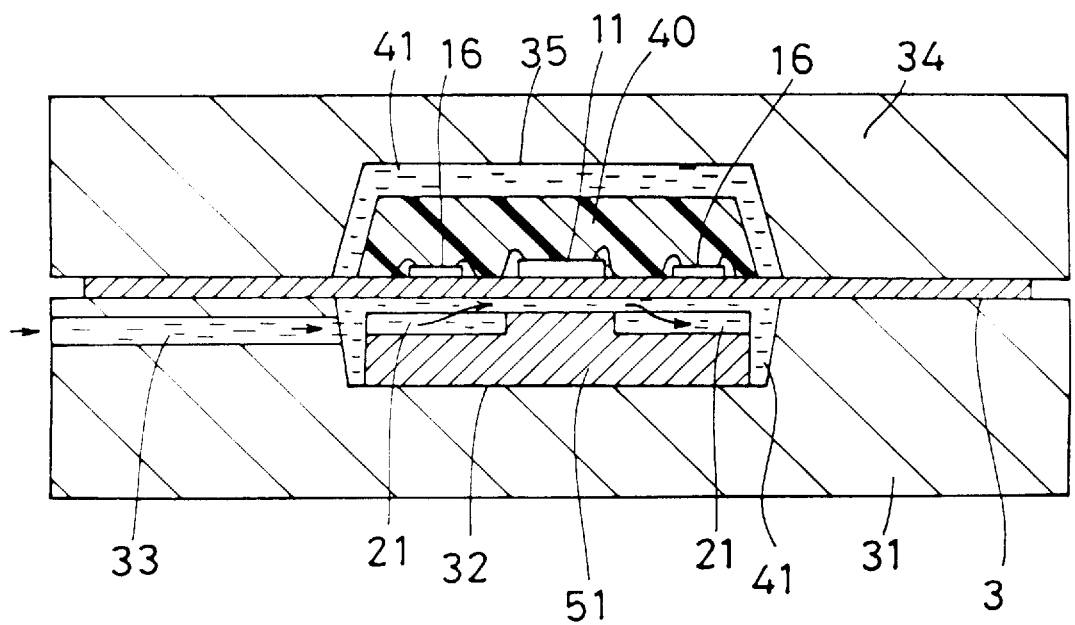
FIG. 8 is a process diagram showing the resin sealing process of the device according to the first preferred embodiment.

Furthermore, since all the grooves 21 are formed to reach the edge of the top main surface of the heat sink 51 at their one ends and to extend in the one direction perpendicular to the elongate direction of the center region 22, it has the advantage that the fluidity of the sealing resin 2 is also excellent in the process of sealing with the sealing resin 2 when manufacturing the device 101. FIG. 8 is a process diagram showing this.

Sealing with the sealing resin 2 is usually performed in two steps. FIG. 8 shows the second step of the sealing process. In this second step of sealing process, the device in which the lead frame 3 and the various elements thereon have been sealed with the first sealing resin 40 is further sealed with the second sealing resin 41. The second step of sealing is carried out using the upper mold 34 having the cavity 35 and the lower mold 31 having the cavity 32.

At this time, the heat sink 51 is placed on the bottom of the cavity 32. The liquid sealing resin 41 is injected through the injection path 33, heated and hardened to complete the sealing with the sealing resin 41. The sealing resin 41 fills the gap between the lead frame 3 and the heat sink 51 to couple them to each other, and preferably, it also covers the surface of the sealing resin 40 as shown in FIG. 8. This prevents peeling in the connection between the sealing resin 40 and the sealing resin 41, or invasion of water etc. from the connection to the inside.

As shown in FIG. 8, in the process of injecting the sealing resin 41, the sealing resin 41 flows in the narrow gap between the lower main surface of the lead frame 3 and the upper main surface of the heat sink 51. Since the plurality of grooves 21 are formed in the top main surface of the heat sink 51, which are all formed along one direction, setting the direction of the device as an object of sealing so that the opening of the injection path usually provided in one position is directed in the elongate direction (the one direction stated above) of the grooves 21 smoothens the flow of the sealing resin 41 in the gap.

Especially, as the grooves 21 are formed in the direction perpendicular to the elongate direction of the zonal center region 22, the sealing resin 41 flowing in the grooves 21 flows in the gap between the center region 22 and the lead frame 3. This produces the advantage that the fluidity is excellent in the narrowest interval between the center region 22 and the lead frame 3. This way, the excellent fluidity of the sealing resin 41 in the gap between the heat sink 51 and the lead frame 3 prevents formation of voids in this gap and a certain breakdown voltage is stably obtained. That is to say, this results in the advantage of high reliability of the device.

As described above, in addition to the close contact between the heat sink 51 and the sealing resin 2 (41), the device 101 has the advantage that the heat radiation characteristic is improved while maintaining the high fluidity of the sealing resin 2 (41) in the sealing process.

As to a material for the second sealing resin 41, which is for filling the gap between the lead frame 3 and the heat sink 51, a material with especially excellent thermal conductivity as compared with the sealing resin 40 is selected as the material, such as an epoxy resin with fillers of silicon nitride mixed therein, for example. As the sealing resin 40, an ordinary epoxy resin at relatively low price is used.

This way, performing the sealing in two steps reduces the used amount of the expensive resin to reduce the manufacturing cost. Furthermore, the first sealing resin 40 provides stiffness to the lead frame 3 in advance, which facilitates precise adjustment of the gap between the lead frame 3 and the heat sink 51 to be filled with the sealing resin 41. The device 101 of the first preferred embodiment is especially suitable for production with the two-step sealing.

In the description above, the zonal region where grooves 21 are not formed in the top main surface of the heat sink 51 is placed in the position dividing the top main surface into two as the center region 22, as shown in FIG. 1. However, this zonal region may be shifted from the two-dividing position. It is necessary, however, that the heat generating elements such as the IGBT element 11 etc. are located in the zonal region and other elements are located in the region where the grooves are formed. For example, it is possible to form the grooves 21 only on one side of the boundary dividing the top main surface of the heat sink 51 into two and form no grooves on the other side.

A device configured this way also improves the close contact between the heat sink 51 and the sealing resin 2 while maintaining the heat radiation efficiency high and also improves the fluidity of the sealing resin 2 (41) in the sealing process. Also, mechanical strength of the heat sink 51 will be fairly high.

<2. Second Preferred Embodiment>

Figure 9:
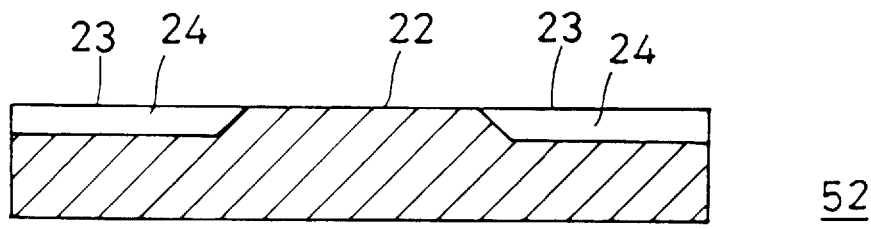
FIG. 9 is a front sectional view of a heat sink of a device according to a second preferred embodiment.

Next, various examples of shapes of the grooves formed in the heat sink will be described. In the heat sink 52 shown in the front section of FIG. 9, the ends on the center region 22 side of the grooves 24 formed in the region 23 on both sides of the center region 22 are formed in a plane inclined at an obtuse angle with respect to the surface of the center region 22. This further improves the fluidity of the sealing resin 41 flowing on the top main surface of the heat sink 52 in the process of sealing with the sealing resin 41 (FIG. 8).

Figure 10:
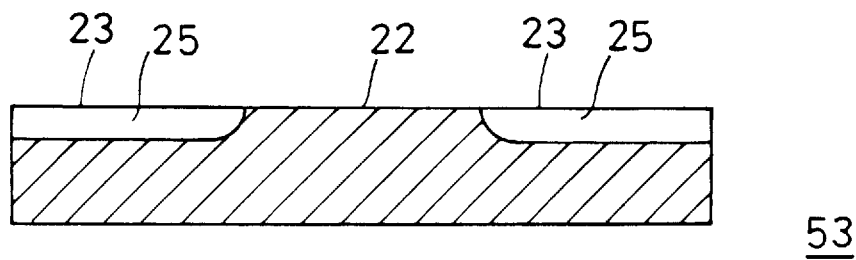
FIG. 10 is a front sectional view of another example of the heat sink of the device according to the second preferred embodiment.

In the heat sink 53 shown in the front sectional view of FIG. 10, the ends on the center region 22 side of the grooves 25 formed in both side region 23 are formed in a concave surface. Accordingly, similarly to the heat sink 52, the fluidity of the sealing resin 41 flowing on the top main surface of the heat sink 53 is further improved in the process of sealing with the sealing resin 41.

Generally, as can be seen from these examples, ends of the grooves on the center region 22 side formed in such shape as smoothly connects the surface of the center region 22 and the bottom of the grooves provide high fluidity to the sealing resin 41 flowing on the top main surface of the heat sink as in the heat sinks 52 and 53.

Figure 11:
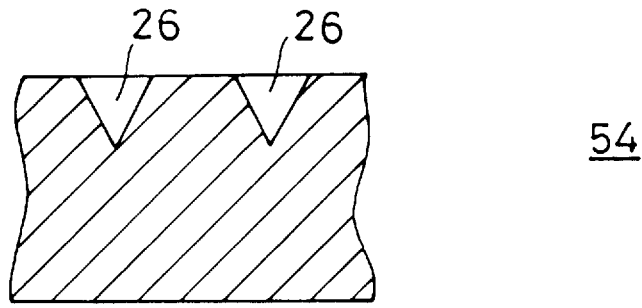
FIG. 11 is a side sectional view of still another example of the heat sink of the device according to the second preferred embodiment.

In the heat sink 54 shown in the side sectional view of FIG. 11, the transverse section of the grooves 26 formed in the both side region 23 are "V-shaped". This provides the advantage that the process of forming the grooves 26 by press processing is especially easy.

<3. Third Preferred Embodiment>

Figure 12:
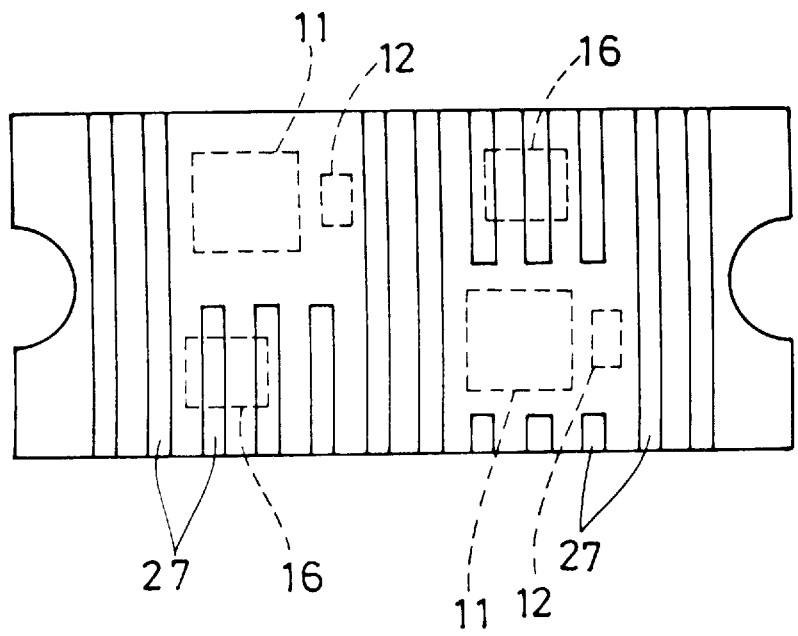
FIG. 12 is a plan view of a heat sink of a device according to a third preferred embodiment.

FIG. 12 is a plan view of a heat sink in a semiconductor device according to a third preferred embodiment, which shows elements and the heat sink in overlap. The device shown in FIG. 12 is provided with two sets of the power circuit 10 and the control circuit 15. Similarly to the heat sink 51, the heat sink 55 of this device has a plurality of grooves 27 formed along one direction, at least one end thereof reaching the edge of the top main surface of the heat sink 55. Accordingly, like the heat sink 51 etc., this provides good fluidity of the sealing resin.

As shown in FIG. 12, in this semiconductor device, the IGBT element 11 and the free wheel diode 12 forming the power circuit 10 are disposed in positions out of the center region which divides the top main surface of the heat sink 55 into two. The grooves 27 are not formed in the region where these heat generating elements are disposed, but they are selectively formed in the other region. The elements forming the control circuit 15 such as the controlling semiconductor element 16 are disposed in the region where the grooves 27 are formed.

The heat sink 55 structured this way also produces the effect of improving the heat radiating efficiency while maintaining the close contact between the heat sink 55 and the sealing resin 2 in the same way as the devices of the first preferred embodiment and so forth. That is to say, as exemplified in this preferred embodiment, even if the grooves are not formed in the region 23 (FIG. 6) on both sides of the center region 22 which divides the top main surface of the heat sink into two, if generally the grooves are selectively formed in the region where heat generating elements are not disposed in the top main surface of the heat sink, it produces the effect of compatibly improving the close contact of the sealing resin and the heat radiating efficiency.

<4. Modified Examples>

(1) Although the preferred embodiments described above have shown semiconductor devices having a plurality of sets of the power circuit 10 and the control circuit 15, it is a matter of course that the invention can also be similarly applied to a device having only one set thereof, providing the same effects.

(2) Although the preferred embodiments described above have shown preferred examples where the control circuit 15 forms a driving circuit and a protection circuit, elements such as the controlling semiconductor element 16 of the control circuit 15 may generally form only the driving circuit. In this case, in the circuit diagram of FIG. 2, the IGBT element 11 does not require the sense electrode S. Also, the wiring coupling the collector electrode C and the sense electrode S with the control circuit 15 is not required in the plurality of wirings 14. Furthermore, part of the external terminals 6 are not required.

It goes without saying that the same effects are obtained in the semiconductor device with the control circuit 15 forming only the driving circuit by disposing the elements included in the control circuit 15 such as the controlling semiconductor element 16 etc. in the region of the top main surface of the heat sink where the grooves are formed and disposing the IGBT element 11 etc. in the region where the grooves are not formed.

(3) The controlling semiconductor element 16 occupies a relatively large area in the control circuit 15 and the IGBT element 11 is a main source of the loss heat in the power circuit 10. Accordingly, in the device of the first preferred embodiment, for example, it may be configured by disposing the IGBT element 11 in the center region 22, disposing the controlling semiconductor element 16 in the both side region 23 and arbitrarily disposing the remaining circuit elements such as the free wheel diode 12, the resistance element 17, etc. in either of the regions. A device constituted this way also provides almost same effects.

(4) Furthermore, generally, it can also be applied to a semiconductor device having only the power circuit 10 and having no control circuit 15. Moreover, it is also applicable to a semiconductor device having only the power semiconductor element such as the IGBT element 11 as circuit elements. In such devices, selective formation of grooves in the region of the top main surface of the heat sink except the region in which power semiconductor elements with heat generation are disposed produces the same effects.

While the invention has been described in detail, the foregoing description is in all aspects illustrative and not restrictive. It is understood that numerous other modifications and variations can be devised without departing from the scope of the invention.

We claim:

1. A semiconductor device, comprising:
   a planer electrically conducting lead frame having first and second surfaces;
   at least one power semiconductor element fixed on said first surface of said lead frame;
   a thermally conducting heat sink having a first surface entirely facing said second surface of said lead frame with a gap therebetween; and
   an electrically insulating sealing resin which fills said gap so as to couple and electrically insulate said lead frame and said heat sink and seal said power semiconductor element;
   wherein:
   said heat sink has first and second regions defined in said first surface;
   said first region is flat;
   said second region is divided in two sub-regions and at least one groove is formed in each of said sub-regions;
   said at least one power semiconductor element is disposed on said first surface of said lead frame over said first region of said heat sink;
   said first region is defined at a center portion of said first surface; and
   said two sub-regions are disposed on each side of said first region.

2. The semiconductor device according to claim 1, further comprising:
   at least one controlling semiconductor element for controlling said at least one power semiconductor element;
   said at least one controlling semiconductor element being fixed on said first surface of said lead frame over at least said second region; and
   said sealing resin further sealing said at least one controlling semiconductor element.

3. The semiconductor device according to claim 2, wherein a transverse sectional form of said at least one groove is rectangular.

4. The semiconductor device according to claim 3, wherein said transverse sectional form is u-shaped.

5. The semiconductor device according to claim 2, wherein a transverse sectional form said groove is v-shaped.

6. The semiconductor device according to claim 1, wherein said at least one groove comprises a plurality of unit grooves.

7. The semiconductor device according to claim 6, wherein all of said plurality of unit grooves extend in one direction.

8. The semiconductor device according to claim 7, wherein at least one end of each of said plurality of unit grooves reaches an edge of said first surface of said heat sink.

9. The semiconductor device according to claim 8, wherein:

said plurality of unit grooves are disposed on each of said sub-regions; and said one direction is a direction perpendicular to an elongate direction of said first region.

10. The semiconductor device according to claim 9, wherein said heat sink is a plate having a second surface opposite said first surface.

11. The semiconductor device according to claim 10, wherein said sealing resin comprises a first sealing body and a second sealing body;

said first sealing body seals said at least one power semiconductor element and said at least one controlling semiconductor element; and said second sealing body fills said gap and also covers a surface of said first sealing body.

12. The semiconductor device according to claim 11, wherein said second sealing body includes an epoxy resin with filler enhancing thermal conductivity mixed therein.

13. The semiconductor device according to claim 12, wherein said filler includes silicon nitride.

14. The semiconductor device according to claim 13, wherein said at least one power semiconductor element is an IGBT.

15. The semiconductor device according to claim 14, further comprising;

a free wheel diode connected to said IGBT;

said free wheel diode being fixed on said first surface of said lead frame; and said sealing resin further sealing said free wheel diode.

16. The semiconductor device according to claim 15, wherein said free wheel diode is fixed on said first surface of said lead frame over said second region.

17. The semiconductor device according to claim 16, wherein said lead frame is substantially formed of copper; and said heat sink is substantially formed of aluminum.

18. The semiconductor device according to claim 9, wherein an end of each of said plurality of unit grooves is formed in a surface smoothly connecting a surface of said first region and a bottom of each of said plurality of unit grooves.

19. The semiconductor device according to claim 18, wherein said end of each of said plurality of unit grooves is formed in an inclined plane surface forming an obtuse angle with the surface of said first region.

20. The semiconductor device according to claim 18, wherein said end of each of said plurality of unit grooves is formed as a concave surface.

* * * * *